United States Patent [19]

Yoshida

[11] Patent Number: 4,775,639
[45] Date of Patent: Oct. 4, 1988

[54] METHOD OF MANUFACTURING GROUP III-V COMPOUND SEMICONDUCTOR SOLAR BATTERY

[75] Inventor: Susumu Yoshida, Itami, Japan

[73] Assignee: Mitsubishi Denki Kabushiki Kaisha, Tokyo, Japan

[21] Appl. No.: 135,076

[22] Filed: Dec. 18, 1987

[30] Foreign Application Priority Data

Dec. 24, 1986 [JP] Japan ................ 61-309797

[51] Int. Cl.$^4$ ............................................. H01L 31/18
[52] U.S. Cl. ......................................... 437/5; 136/262;
148/DIG. 66; 437/119; 437/133
[58] Field of Search ............... 437/5, 119, 130, 133;
136/262; 148/DIG. 66

[56] References Cited

U.S. PATENT DOCUMENTS

| | | | |
|---|---|---|---|
| 4,126,930 | 11/1978 | Moon | 437/5 |
| 4,178,195 | 12/1979 | Hovel et al. | 437/2 |
| 4,235,651 | 11/1980 | Kamath et al. | 437/5 |

FOREIGN PATENT DOCUMENTS

56-83933  7/1981  Japan ................ 437/119

OTHER PUBLICATIONS

J. M. Woodall et al, "LPE Growth of GaAs–Ga$_{1-x}$Al$_x$ As Solar Cells", *J. Crystal Growth*, vol. 39, pp. 108–116 (1977).

*Primary Examiner*—Aaron Weisstuch
*Attorney, Agent, or Firm*—Oblon, Fisher, Spivak, McClelland, & Maier

[57] ABSTRACT

After a liquid-phase epitaxial growth step by an n-type GaAs saturated solution is terminated, a substrate is temporarily dipped in an undoped GaAs saturated or supersaturated solution, and thereafter liquid-phase epitaxial growth is performed by a p-type Al$_x$Ga$_{1-x}$As saturated solution. Thus, the n-type GaAs saturated solution is prevented from being mixed into the p-type Al$_x$Ga$_{1-x}$As saturated solution to contaminate the same, whereby a solar battery of high quality can be obtained even if the number of times of crystallization is increased.

4 Claims, 2 Drawing Sheets

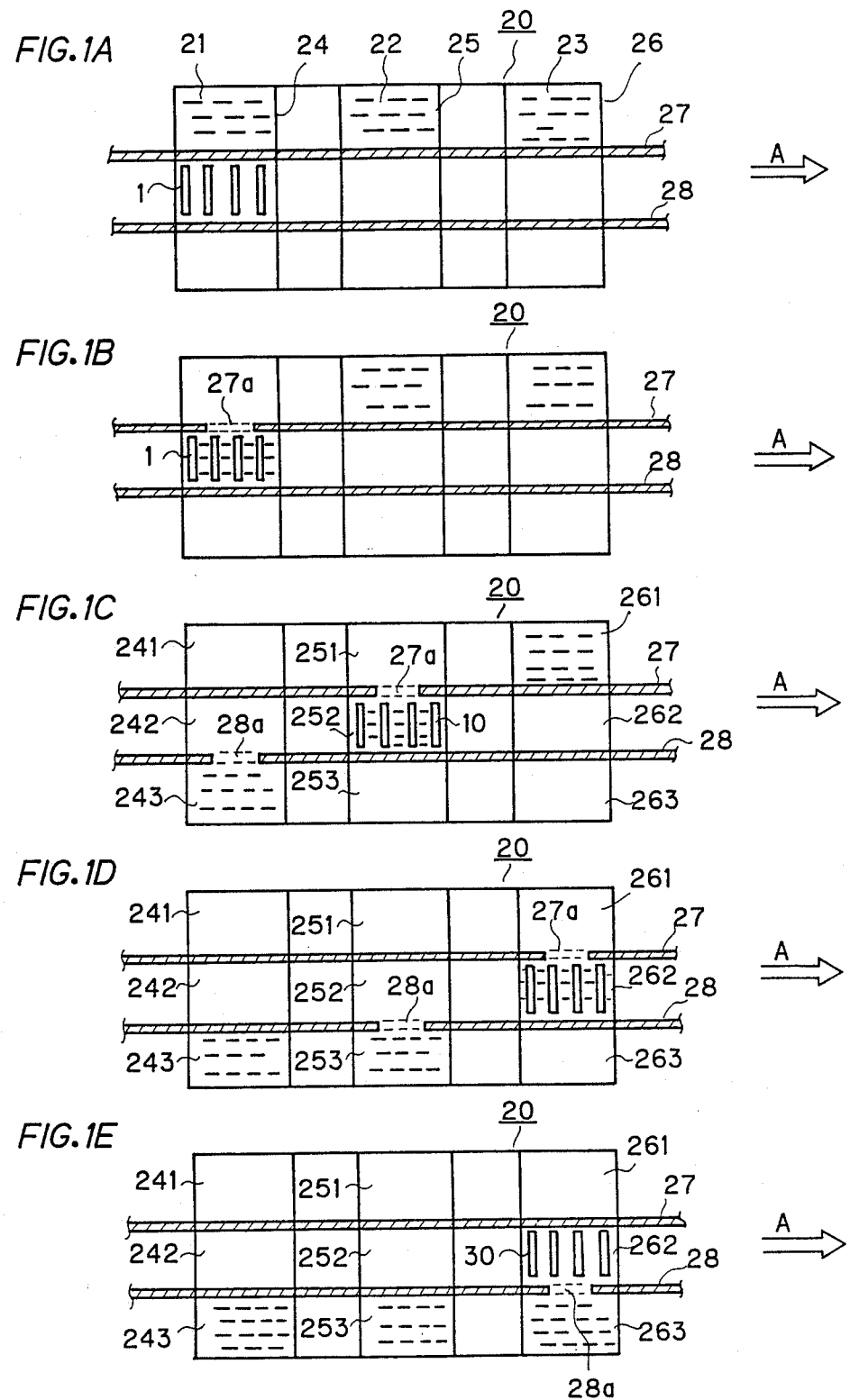

METHOD OF MANUFACTURING GROUP III-V COMPOUND SEMICONDUCTOR SOLAR BATTERY

BACKGROUND OF THE INVENTION

1. Field of the Invention

The present invention relates to a method of manufacturing a group III-V compound semiconductor solar battery such as a gallium arsenide (GaAs) solar battery.

2. Description of the Prior Art

In recent years, studies have been made to increase the photoelectric conversion efficiency of silicon (Si) and group III-V compound semiconductor solar batteries. Through such studies, it has been found that a GaAs solar battery can attain higher improvement in conversion efficiency than a Si solar battery and that such an effect is further increased when group III-V ternary compound is employed with GaAs to form the solar battery. In the latter case, generally an n-type GaAs layer of excellent crystal quality is epitaxially grown on an n-type GaAs crystal substrate which is prepared by slicing n-type GaAs crystals obtained by the horizontal Bridgeman method (HB) or the liquid encapsulated Czochralski method (LEC), and a p-type GaAs region is formed in the surface part of the n-type GaAs layer to form p-n junction, and then a p-type $Al_xGa_{1-x}As$ layer is further epitaxially grown on the same. Such a semiconductor device is manufactured by employing a liquid-phase epitaxial (LPE) growth technique.

For example, an n-type GaAs saturated solution formed with Ga as a solvent, GaAs as a solute and tellurium (Te) as an n-type impurity and a p-type $Al_xGa_{1-x}As$ saturated solution formed with Ga as a solvent, GaAs and Al as solutes and Mg as a p-type impurity are placed in the same crystal growth boat. Then, an n-type GaAs crystal substrate prepared by slicing n-type GaAs crystals obtained by the HB method or the LEC method is dipped in the n-type GaAs saturated solution and then in the p-type $Al_xGa_{1-x}As$ saturated solution at respective prescribed temperatures which are lowered to respective prescribed temperatures for crystal growth after respective prescribed retaining times. Such crystal growth steps are continuously performed in the same crystal growth boat.

Namely, after completion of n-type GaAs epitaxial growth, the n-type GaAs crystal substrate dipped in the n-type GaAs saturated solution of Ga and GaAs containing the n-type impurity is separated from the n-type GaAs saturated solution and then continuously dipped in the p-type $Al_xGa_{1-x}As$ saturated solution of Ga, GaAs and Al containing the p-type impurity and retained for the prescribed time so that the surface part of the n-type GaAs epitaxial layer is inverted to a p-type to form a p-n junction portion serving as an operation layer of a GaAs solar battery. Then, the p-type $Al_xGa_{1-x}As$ saturated solution is lowered to the prescribed temperature to epitaxially grow a p-type type $Al_xGa_{1-x}As$ layer.

In the aforementioned manufacturing method, however, the characteristics of the GaAs solar battery are largely fluctuated by the number of times of crystallization. Namely, since the n-type GaAs saturated solution adhered to the substrate is mixed into the p-type $Al_xGa_{1-x}As$ saturated solution when the substrate completed with n-type GaAs epitaxial growth is dipped in the p-type $Al_xGa_{1-x}As$ saturated solution, the p-n junction characteristic cannot be stably controlled and the electric characteristic of the GaAs solar battery is deteriorated as the number of times of crystallization is increased.

SUMMARY OF THE INVENTION

According to the present invention, a method of manufacturing a group III-V compound semiconductor solar battery comprises the steps of preparing a first conductivity type group III-V compound semiconductor crystal substrate; bringing the substrate into contact with a first conductivity type group III-V compound saturated solution to form an epitaxial substrate having a first conductivity type group III-V compound epitaxial layer crystallized on the substrate; dipping the epitaxial substrate in an undoped group III-V compound saturated or supersaturated solution for a prescribed time; and bringing the epitaxial substrate into contact with a second conductivity type group III-V ternary compound saturated solution to form a p-n junction by inverting a surface of the epitaxial substrate to a second conductivity type and to crystallize a second conductivity type group III-V ternary compound epitaxial layer on the surface.

Accordingly, a principal object of the present invention is to provide a method of manufacturing a group III-V compound semiconductor solar battery whose electric characteristic is not deteriorated even if the number of times of crystallization is increased.

Another object of the present invention is to provide a method of manufacturing a group III-V compond semiconductor solar battery in which a saturated solution employed for a preceding liquid-phase epitaxial growth step is prevented from being mixed into a saturated solution employed in a later liquid-phase epitaxial growth step in the manufacturing process.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1A to FIG. 1F typically illustrate states of a crystal growth boat in respective liquid-phase epitaxial growth steps in an embodiment of a method of manufacturing a group III-V compound semiconductor solar battery according to the present invention.

DESCRIPTION OF THE PREFERRED EMBODIMENT

Figure 2A:
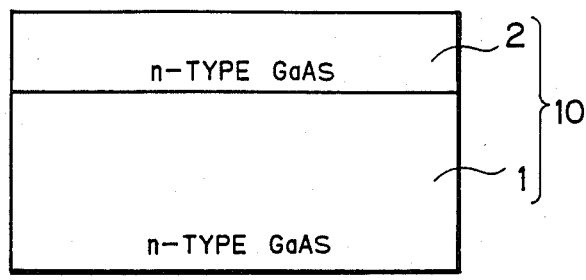
FIG. 2A to FIG. 2C are sectional views showing the structure of a GaAs solar battery during respective steps of an embodiment of the method of manufacturing a group III-V compound semiconductor solar battery according to the present invention.

FIG. 1A to FIG. 1F are block diagrams typically showing states of a crystal growth boat in liquid-phase epitaxial steps in an embodiment of the method of manufacturing a group III-V compound semiconductor solar battery according to the present invention. A crystal growth boat 20 has three storage regions 24, 25 and 26. The storage region 24 has first, second and third chambers 241, 242 and 243 which serve as receptacles for an n-type GaAs saturated solution 21 containing Sn or Te etc. as an n-type inpurity. The storage region 25 has first, second and third chambers 251, 252 and 253 which serve as receptacles for an undoped GaAs supersaturated solution 22. The storage region 26 has first, second and third chambers 261, 262 and 263 which serve as receptacles for a p-type $Al_xGa_{1-x}As$ saturated solution 23 containing Mg etc. as a p-type impurity. The first, second and third chambers in each of the storage regions 24, 25 and 26 are separated by sliders 27 and 28 having holes 27a and 28a respectively.

Figure 2B:
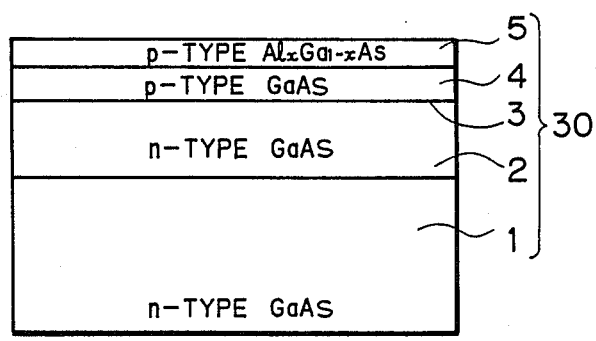
Figure 2C:
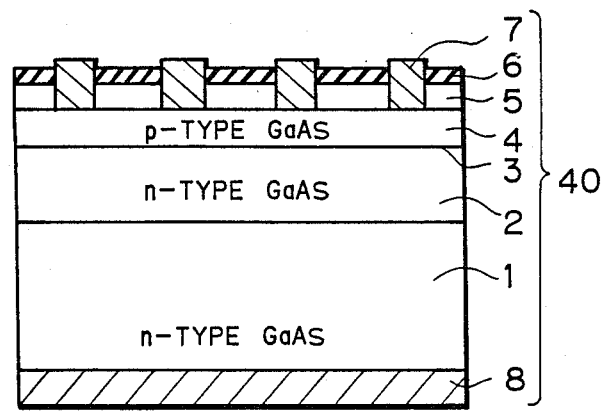

FIG. 2A to FIG. 2C are sectional views showing a structure of a GaAs solar battery during respective steps in the embodiment of the inventive method of manufacturing a group III–V compound semiconductor solar battery. With reference to FIG. 1A to FIG. 1E and FIG. 2A to FIG. 2C, description is now made on a method of manufacturing a GaAs solar battery according to the embodiment of the present invention.

At first, the crystal growth boat 20 has the n-type GaAs saturated solution 21, the undoped GaAs supersaturated solution 22 and the p-type $Al_xGa_{1-x}As$ saturated solution 23 in the first chambers 241, 251 and 261 respectively, as shown in FIG. 1A.

Then, as shown in FIG. 1B, the sliders 27 and 28 are moved in a direction A, thereby to dip an n-type GaAs crystal substrate 1 doped with Si and having a carrier density of $1 \times 10^{17} cm^{-3}$ to $2 \times 10^{18} cm^{-3}$ in the n-type GaAs saturated solution 21 flowing into the second chamber 242 through the hole 27a of the slider 27. Thereafter, the temperature of the n-type GaAs saturated solution 21 is lowered from a prescribed temperature level to another prescribed temperature level, thereby to crystallize n-type GaAs doped with Sn or Te on the n-type GaAs crystal substrate 1. Thus, an epitaxial substrate 10, shown in FIG. 2A, having an n-type GaAs epitaxial layer 2 serving as a buffer layer on the n-type GaAs crystal substrate 1 is obtained.

Then, as shown in FIG. 1C, the slider 28 is moved in the direction A, thereby to transfer the n-type GaAs saturated solution 21 in the second chamber 242 of the storage region 24 into the third chamber 243 through the hole 28a of the slider 28. In this state, the n-type GaAs epitaxial substrate 10 having the n-type GaAs epitaxial layer 2 is still in the second chamber 242 of the storage region 24. The second chambers 242, 252 and 262 of the storage regions 24, 25 and 26 are slidingly moved in the direction A so that the second chamber 242 of the storage region 24, storing the n-type GaAs epitaxial substrate 10, becomes the second chamber 252 of the storage region 25 and the second chamber 252 of the storage region 25 becomes the second chamber 262 of the storage region 26. Then, the slider 27 is moved in the direction A, thereby to dip the n-type GaAs epitaxial substrate 10 in the undoped GaAs supersaturated solution 22 flowing from the first chamber 251 of the storage region 25 into the second chamber 252 through the hole 27a of the slider 27. This state is maintained for a prescribed time at a prescribed temperature.

After a lapse of the prescribed time, the slider 28 is moved in the direction A thereby to transfer the undoped GaAs supersaturated solution 22 in the second chamber 252 of the storage region 25 to the third chamber 253 through the hole 28a of the slider 28, as shown in FIG. 1D. In this state, the n-type GaAs epitaxial substrate 10 is still in the second chamber 252 of the storage region 25. The second chambers 242, 252 and 262 of the storage regions 24, 25 and 26 are slidingly moved in the direction A, so that the second chamber 252 of the storage region 25, storing the n-type GaAs epitaxial substrate 10, becomes the second chamber 262 of the storage region 26. Then, the slider 27 is moved in the direction A, thereby to dip the n-type GaAs epitaxial substrate 10 in the p-type $Al_xGa_{1-x}As$ saturated solution 23 containing Mg as a p-type impurity, which has flowed from the first chamber 261 of the storage region 26 into the second chamber 262 through the hole 27a of the slider 27.

While the n-type GaAs epitaxial substrate 10 is dipped in the p-type $Al_xGa_{1-x}As$ saturated solution 23 for a prescribed time in the second chamber 262 of the storage region 26, atoms of Mg, which are the p-type impurity contained in the p-type $Al_xGa_{1-x}As$ saturated solution 23, are diffused into the n-type GaAs epitaxial layer 2 doped with Sn or Te on the n-type GaAs epitaxial substrate 10, whereby the surface portion of the layer 2 is inverted into a p-type. Thus, a p-type GaAs layer 4 shown in FIG. 2B is formed and a p-n junction region 3 is defined between the same and the n-type GaAs epitaxial layer 2. This p-n junction region 3 serves as the main photovoltaic p-n junction region for the solar battery.

Then, an epitaxial layer 5 of p-type $Al_xGa_{1-x}As$, serving as a window member, is epitaxially grown as shown in FIG. 2B, in order to reduce surface recombination velocity on the surface of the p-type GaAs layer 4. Namely, the temperature of the crystal growth boat 20 is lowered to a prescribed temperature level, and the sliders 27 and 28 are moved in the direction A when desired thickness of the epitaxial layer 5 is obtained. Then, as shown in FIG. 1E, the p-type $Al_xGa_{1-x}As$ saturated solution 23 is transferred from the second chamber 262 of the storage region 26 to the third chamber 263 through the hole 28a of the slider 28, whereby the growth of the p-type $Al_xGa_{1-x}As$ epitaxial layer 5 is terminated. Thus obtained is a GaAs solar battery epitaxial substrate 30, which has a p-type GaAs layer 4 of high quality formed by diffusion of Mg atoms serving as the p-type impurity, and a p-type $Al_x Ga_{1-x}As$ layer 5.

Then, as shown in FIG. 2C, a $Si_3N_4$ film 6, for example, is formed on the surface of the p-type $Al_xGa_{1-x}As$ layer 5 as an antireflection film for incident light through a method such as CVD (chemical vapor deposition). Thereafter, a positive electrode 7 is formed on the p-type GaAs layer 4 by standard photoengraving techniques, and a negative electrode 8 is formed on the n-type GaAs crystal substrate 1, so that a GaAs solar battery element 40 is obtained.

In the aforementioned method of manufacturing the GaAs solar battery element 40, the n-type GaAs saturated solution 21 can be prevented from being mixed into the p-type $Al_xGa_{1-x}As$ saturated solution 23 by the undoped GaAs supersaturated solution 22. Therefore, dispersion of the p-type $Al_xGa_{1-x}As$ saturated solution 23 for each lot can be reduced when the epitaxial growth step is performed for each lot of the n-type GaAs crystal substrate 1. Thus, this method is excellent in control and stability of the p-n junction characteristic.

Further, since Mg has a low vapor pressure as compared with zinc (Zn), substantially no evaporation takes place during epitaxial growth and dispersion in thickness of the p-type GaAs layer 4 for each lot is small, whereby a GaAs solar battery having stable characteristics and excellent reliability can be obtained.

Although the undoped GaAs supersaturated solution 22 is employed in the above embodiment to prevent mixing of the n-type GaAs saturated solution 21 into the p-type $Al_xGa_{1-x}As$ saturated solution 23, an undoped GaAs saturated solution may be employed to attain a similar effect.

According to the inventive method of manufacturing a group III–V compound semiconductor solar battery, a saturated solution such as an n-type GaAs saturated solution employed in a preceding liquid-phase epitaxial growth step is prevented from being mixed into a saturated solution such as a p-type $Al_xGa_{1-x}As$ saturated solution employed in a later liquid-phase epitaxial growth step, so that contamination of the latter solution is prevented. Therefore, a group III–V compound semiconductor solar battery, such as a GaAs solar battery, of high conversion efficiency can be obtained, whose electric characteristic is not deteriorated even if the number of times of crystallization is increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a group III–V compound semiconductor solar battery, comprising the steps of:
    preparing a first conductivity type group III–V compound crystal substrate;
    bringing said substrate into contact with a first conductivity type group III–V compound saturated solution to form an epitaxial substrate having a first conductivity type group III–V compound epitaxial layer crystallized on said substrate;
    dipping said epitaxial substrate in an undoped group III–V compound saturated or supersaturated solution for a prescribed time; and
    bringing said epitaxial substrate into contact with a second conductivity type group III–V ternary compound saturated solution to form a p-n junction by inverting a surface of said epitaxial substrate into a second conductivity type and to crystallize a second conductivity type group III–V ternary compound epitaxial layer on the surface.

2. A method of manufacturing a group III–V compound semiconductor solar battery in accordance with claim 1, wherein said group III–V compound is GaAs.

3. A method of manufacturing a group III–V compound semiconductor solar battery in accordance with claim 1, wherein said group III–V ternary compound is $Al_xGa_{1-x}As$.

4. A method of manufacturing a group III–V compound semiconductor solar battery in accordance with claim 1, wherein said first conductivity type is n-type and said second conductivity type is p-type

* * * * *